US012641783B2

(12) United States Patent
Jourba et al.

(10) Patent No.: US 12,641,783 B2
(45) Date of Patent: May 26, 2026

(54) MEMORY DEVICE FORMED ON SILICON-ON-INSULATOR SUBSTRATE, AND METHOD OF MAKING SAME

(71) Applicant: Silicon Storage Technology, Inc., San Jose, CA (US)

(72) Inventors: Serguei Jourba, Aix en Provence (FR); Catherine Decobert, Pourrieres (FR); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 257 days.

(21) Appl. No.: 18/228,414

(22) Filed: Jul. 31, 2023

(65) Prior Publication Data

US 2024/0389319 A1     Nov. 21, 2024

Related U.S. Application Data

(60) Provisional application No. 63/466,821, filed on May 16, 2023.

(51) Int. Cl.
  H10B 41/30      (2023.01)
  H10B 41/40      (2023.01)
  (Continued)

(52) U.S. Cl.
  CPC ............. H10B 41/30 (2023.02); H10B 41/40 (2023.02); H10D 30/0411 (2025.01);
  (Continued)

(58) Field of Classification Search
  CPC .... H10B 41/30; H10B 41/40; H10D 30/0411; H10D 30/683; H10D 30/6892; H10D 64/035; H10D 30/681
  See application file for complete search history.

(56) References Cited

U.S. PATENT DOCUMENTS

| | | | |
|---|---|---|---|
| 4,771,016 A | 9/1988 | Bajor | |
| 5,061,642 A | 10/1991 | Fujioka | |
| (Continued) | | | |

FOREIGN PATENT DOCUMENTS

| | | |
|---|---|---|
| JP | H08-255846 A | 10/1996 |
| KR | 10-2020-0138807 | 12/2020 |
| (Continued) | | |

OTHER PUBLICATIONS

Mika, et al., "Experimental Fabrication of an ESF3 Floating Gate Flash Cell in an FD-SOI Process," pp. 1-4, IEEE 52nd European Solid-State Device Research Conference, 2022.

(Continued)

*Primary Examiner* — David Vu
(74) *Attorney, Agent, or Firm* — DLA Piper LLP (US)

(57) ABSTRACT

A memory device includes a SOI substrate comprising bulk silicon, an insulation layer vertically over the bulk silicon, and a silicon layer vertically over the insulation layer. A memory cell includes source and drain regions formed in the bulk silicon with a channel region of the bulk silicon extending therebetween, and a floating gate which includes a first portion of the silicon layer disposed vertically over and insulated from a first portion of the channel region by the insulation layer. The first portion of the silicon layer is epitaxially thickened or a layer of polysilicon is formed on the first portion of the silicon layer. A select gate is disposed vertically over and insulated from a second portion of the channel region. A control gate is disposed vertically over and insulated from the floating gate. An erase gate is disposed vertically over and insulated from the source region.

16 Claims, 11 Drawing Sheets

(51) Int. Cl.
   *H10D 30/01* (2025.01)
   *H10D 30/68* (2025.01)
   *H10D 64/01* (2025.01)

(52) U.S. Cl.
   CPC ....... *H10D 30/683* (2025.01); *H10D 30/6892*
   (2025.01); *H10D 64/035* (2025.01)

(56) References Cited

U.S. PATENT DOCUMENTS

| | | | |
|---|---|---|---|
| 5,417,180 | A | 5/1995 | Nakamura |
| 5,888,297 | A | 3/1999 | Ogura |
| 6,747,310 | B2 | 6/2004 | Fan |
| 7,868,375 | B2 | 1/2011 | Liu |
| 7,927,994 | B1 | 4/2011 | Liu |
| 9,123,822 | B2 | 9/2015 | Yoo et al. |
| 9,245,897 | B2 | 1/2016 | Ma et al. |
| 9,276,005 | B1 | 3/2016 | Zhou |
| 9,431,407 | B2 | 8/2016 | Su |
| 9,634,020 | B1 | 4/2017 | Su |
| 10,878,915 | B1 * | 12/2020 | Chang .................... G11C 16/12 |
| 11,164,881 | B2 * | 11/2021 | Cai .................... G11C 11/5628 |
| 2015/0021679 | A1 * | 1/2015 | Tsair ..................... H10B 41/00 |
| | | | 438/266 |
| 2015/0263040 | A1 | 9/2015 | Su |
| 2018/0151579 | A1 * | 5/2018 | Liu ........................ H10B 41/30 |

| | | | |
|---|---|---|---|
| 2019/0393234 | A1 * | 12/2019 | Lin ........................ H10B 41/44 |
| 2020/0135275 | A1 * | 4/2020 | Cai ........................ H10B 12/20 |
| 2022/0223740 | A1 | 7/2022 | Melde |

FOREIGN PATENT DOCUMENTS

| | | |
|---|---|---|
| TW | 200522278 | 7/2005 |
| TW | 201436113 | 9/2014 |
| TW | I 462234 | 11/2014 |
| TW | 201603244 | 1/2016 |
| TW | 201926653 A | 7/2019 |

OTHER PUBLICATIONS

PCT Search Report & Written Opinion mailed on Feb. 9, 2024 corresponding to the related PCT Patent Application No. PCT/US2023/029275.

Taiwanese Office Action mailed on May 5, 2025 corresponding to the related Taiwanese Patent Application No. 113115016. (Attached is the English Google Translations of the Taiwanese Office Action.).

S. Korean Office Action mailed on Jan. 21, 2026 corresponding to the related S. Korean Patent Application No. 10-2025-7034735. (Attached is a copy of the English and Korean Translations of the S. Korean Office Action.).

Taiwanese Office Action mailed on Mar. 19, 2026, corresponding to the related Taiwanese Patent. Application No. 113115016. (Also attached is the English translation of the Taiwanese Office Action).

* cited by examiner

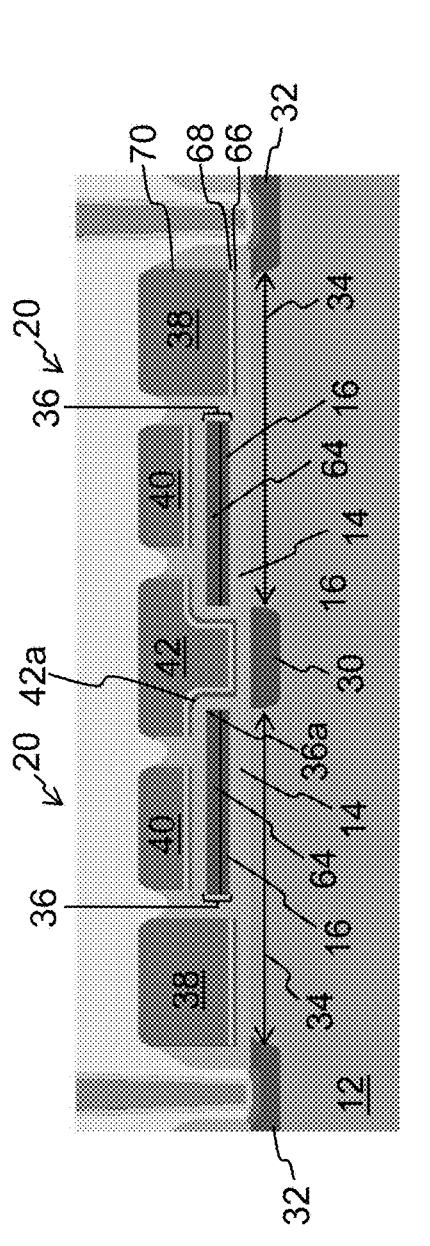
FIG. 3A
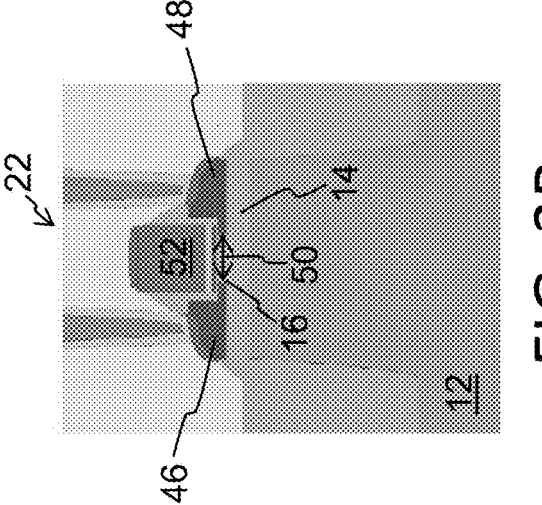
FIG. 3C
FIG. 3B

66/68/70

MEMORY DEVICE FORMED ON SILICON-ON-INSULATOR SUBSTRATE, AND METHOD OF MAKING SAME

RELATED APPLICATIONS

This application claims the benefit of U.S. Provisional Application No. 63/466,821, filed May 16, 2023, and which is incorporated herein by reference.

FIELD OF THE INVENTION

The present disclosure relates to non-volatile memory devices.

BACKGROUND OF THE INVENTION

Non-volatile memory devices (i.e., devices that at least include non-volatile memory cells) formed on bulk silicon semiconductor substrates are well known. For example, U.S. Pat. Nos. 6,747,310, 7,868,375 and 7,927,994 disclose memory cells with four gates (floating gate, control gate, select gate and erase gate) formed on a bulk semiconductor substrate. Source and drain regions are formed as diffusion implant regions into the substrate, defining a channel region therebetween in the substrate. The floating gate is disposed vertically over and insulated from a first portion of the channel region for directly controlling the conductivity of the first portion of the channel region (i.e., there is no intervening gate between the floating gate and the first portion of the channel region), the select gate is disposed vertically over and insulated from a second portion of the channel region for directly controlling the conductivity of the second portion of the channel region (i.e., there is no intervening gate between the select gate and the second portion of the channel region), the control gate is disposed vertically over and insulated from the floating gate for capacitive coupling therewith, and the erase gate is disposed vertically over and insulated from the source region. Bulk substrates are ideal for these type of memory devices because deep diffusions into the substrate can be used for forming the source and drain region junctions. These three patents are incorporated herein by reference for all purposes.

Silicon-on-insulator (also referred to herein as SOI) devices are also well known in the art of microelectronics. SOI devices differ from bulk silicon substrate devices in that the substrate is layered with an embedded insulation layer under the silicon surface (i.e. silicon-insulator-silicon) instead of being solid silicon (i.e., bulk silicon). With an SOI substrate, there is a thin silicon layer vertically over the insulation layer, which in turn is vertically over the bulk silicon. With SOI devices, the silicon junctions (e.g., source and drain regions) are formed in the thin silicon layer. The insulation layer is typically silicon dioxide (oxide). This substrate configuration reduces parasitic device capacitance, thereby improving performance. SOI substrates can be manufactured by SIMOX (separation by implantation of oxygen using an oxygen ion beam implantation—see U.S. Pat. Nos. 5,888,297 and 5,061,642), wafer bonding (bonding oxidized silicon with a second substrate and removing most of the second substrate—see U.S. Pat. No. 4,771,016), or seeding (topmost silicon layer is grown directly on the insulation layer—see U.S. Pat. No. 5,417,180). These four patents are incorporated herein by reference for all purposes.

Non-volatile memory devices are not conducive to SOI substrates, because forming the source and drain regions in the thin silicon layer limits the depths of these regions, negatively impacting memory cell performance. Yet, other devices typically formed on the same substrate, such as CMOS logic devices and HV devices benefit from being formed on SOI substrates, because the source/drain regions of those device need not have the depth of the source/drain regions of the memory cells, and are therefore more compatible with the thin silicon layer of SOI substrates. There is a need to combine the advantages of SOI substrates with non-volatile memory devices that are more suited for being formed on bulk silicon substrates.

BRIEF SUMMARY OF THE INVENTION

The aforementioned problems and needs are addressed by a memory device that includes a SOI substrate that comprises bulk silicon, an insulation layer vertically over the bulk silicon, and a silicon layer vertically over the insulation layer, and a memory cell disposed in a memory cell region of the SOI substrate. The memory cell includes a source region and a drain region formed in the bulk silicon, with a channel region of the bulk silicon extending therebetween, a floating gate, a select gate, a control gate and an erase gate. The floating gate includes a first portion of the silicon layer disposed vertically over and insulated from a first portion of the channel region by the insulation layer, and a layer of polysilicon on the first portion of the silicon layer. The select gate is disposed vertically over and insulated from a second portion of the channel region. The control gate is disposed vertically over and insulated from the floating gate. The erase gate is disposed vertically over and insulated from the source region.

A method of forming a memory device includes providing a SOI substrate that comprises bulk silicon, an insulation layer vertically over the bulk silicon, and a silicon layer vertically over the insulation layer, and forming a memory cell in a memory cell region of the SOI substrate. The memory cell formation includes forming a source region and a drain region in the bulk silicon, with a channel region of the bulk silicon extending therebetween, forming a floating gate comprising a first portion of the silicon layer disposed vertically over and insulated from a first portion of the channel region by the insulation layer, wherein the forming the floating gate comprises epitaxially growing silicon on the first portion of the silicon layer or forming a layer of polysilicon on the first portion of the silicon layer, forming a select gate disposed vertically over and insulated from a second portion of the channel region, forming a control gate disposed vertically over and insulated from the floating gate, and forming an erase gate disposed vertically over and insulated from the source region.

Other objects and features of the present disclosure will become apparent by a review of the specification, claims and appended figures.

BRIEF DESCRIPTION OF THE DRAWINGS

FIG. 3A is a side cross sectional view of memory cells according to a memory device of a second example.

FIG. 3B is a side cross sectional view of a logic device according to the memory device of the second example.

FIG. 3C is a side cross sectional view of a high voltage device according to the memory device of the second example.

DETAILED DESCRIPTION OF THE INVENTION

The present disclosure is directed to non-volatile memory cells, formed on a silicon-on-insulator substrate (also referred to herein as SOI substrate), where the thin layer of silicon of the SOI substrate is used for at least part of the floating gates of the memory cells, the insulation layer of the SOI substrate is used as the insulation layer between the floating gates and their respective channel regions, and the source and drain regions of the memory cells are formed in the bulk silicon region of the SOI substrate. On the same SOI substrate, logic devices can be formed with their source and drain regions formed in the thin silicon layer, and high voltage devices can be formed in a region of the SOI substrate in which the thin silicon layer and insulating layer are removed so that the source and drain regions of the high voltage devices are formed in the bulk silicon.

Figure 1:
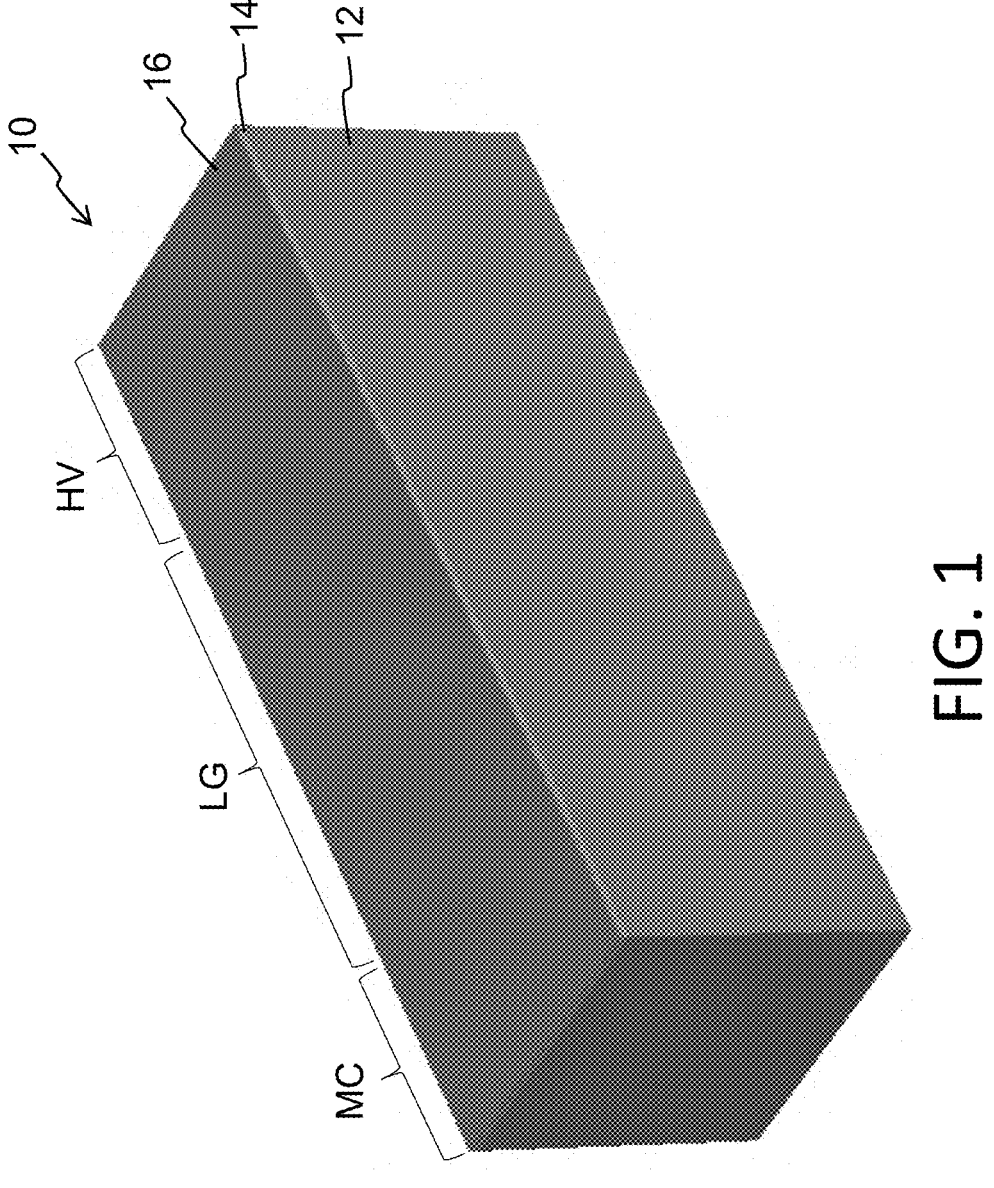
FIG. 1 is a perspective view of a silicon-on-insulator (SOI) substrate.

FIG. 1 illustrates a silicon-on-insulator (SOI) substrate 10, which includes three portions: underlying bulk silicon 12, an insulation layer 14 (e.g. oxide-referred to as buried oxide-BOX) vertically over the bulk silicon 12, and a thin silicon layer 16 vertically over the insulation layer 14. Forming SOI substrates is well known in the art as described above and in the U.S. patents identified above, and therefore is not further described herein. The SOI substrate 10 can have three regions: a memory cell region MC in which memory cells are to be formed, a logic device region LG in which logic devices are to be formed, and a high voltage device region HV in which high voltage devices are to be formed.

Figure 2A:
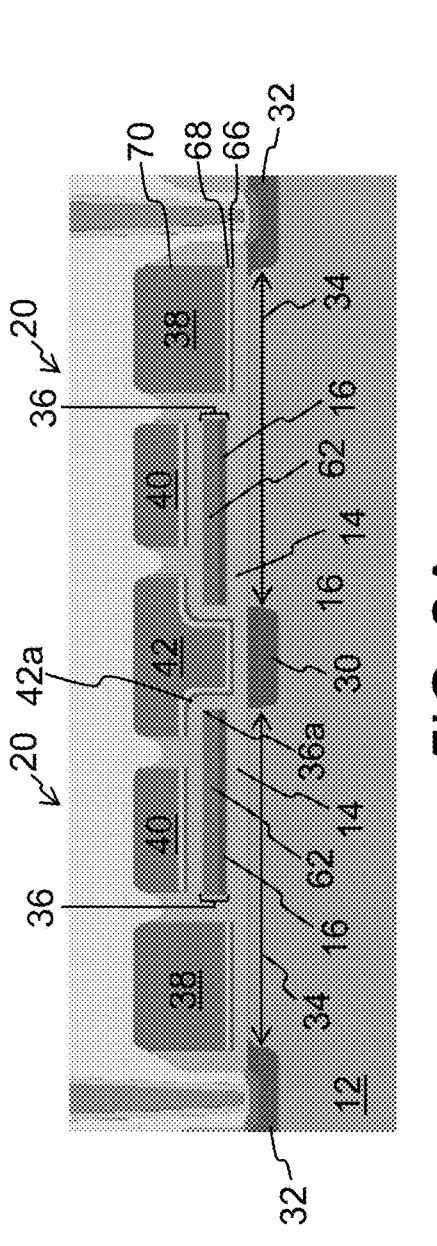
FIG. 2A is a side cross sectional view of memory cells according to a memory device of a first example.
Figure 2C:
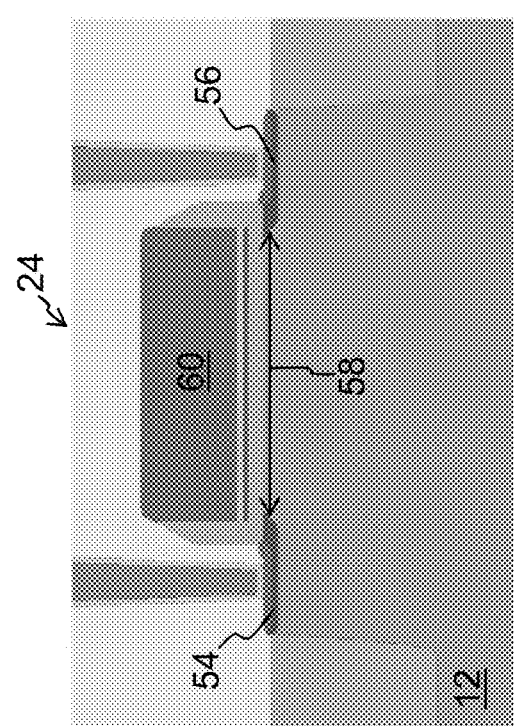
FIG. 2C is a side cross sectional view of a high voltage device according to the memory device of the first example.
Figure 2B:
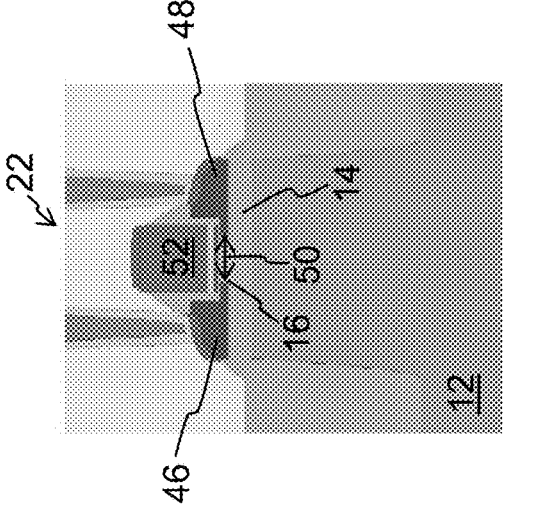
FIG. 2B is a side cross sectional view of a logic device according to the memory device of the first example.

FIGS. 2A-2C illustrates a first example of a memory device formed on an SOI substrate 10, which includes memory cells 20 formed in the memory cell region MC (as shown in FIG. 2A), logic devices 22 formed in the logic device region LG (as shown in FIG. 2B), and high voltage devices 24 formed in the high voltage device region HV (as shown in FIG. 2C).

The memory cell 20 includes source region 30 and drain region 32 formed in the bulk silicon 12, with a channel region 34 of the bulk silicon 12 therebetween. A floating gate 36 is disposed vertically over and insulated from a first portion of the channel region 34, a select gate 38 is disposed vertically over and insulated from a second portion of the channel region 34, a control gate 40 is disposed vertically over and insulated from the floating gate 36, and an erase gate 42 is disposed vertically over and insulated from the source region 30. The memory cells 20 can be formed in pairs, where the pair of memory cells 20 share a common source region 30 and common erase gate 42, and pairs of memory cells can be formed end to end, sharing common drain regions, as illustrated in FIG. 2A.

The floating gate 36 includes a first portion of the silicon layer 16 of the SOI substrate 10, which is insulated from the bulk silicon 12 by the insulation layer 14 of the SOI substrate 10. Specifically, in forming the memory cell 20, the silicon layer 16 and insulation layer 14 of the SOI substrate remain intact for the floating gate 36, but are removed from other portions of the memory cell 20. A second portion of the silicon layer 16 and insulation layer 14 of the SOI substrate remain intact in the logic device region LG as well, in which logic device 22 includes a logic source region 46 and a logic drain region 48 formed in the second portion of the silicon layer 16, with a logic channel region 50 of the second portion of the silicon layer 16 extending there between. A logic gate 52 is disposed vertically over and insulated from the logic channel region 50 for directly controlling the conductivity thereof. Selective epitaxial growth can be used to increase the vertical thickness of the logic source region 46 and the logic drain region 48, as shown in FIG. 2B. Finally, the silicon layer 16 and insulation layer 14 of the SOI substrate are removed from the high voltage device region HV, in which high voltage device 24 includes a HV source region 54 and a HV drain region 56 formed in the bulk silicon 12, with a HV channel region 58 of the bulk silicon 12 extending there between. An HV gate 60 is disposed vertically over and insulated from the HV channel region 60 for directly controlling the conductivity thereof.

The select gate 38, control gate 40, erase gate 42, logic gate 52 and HV gate 60 can be high-k metal gates. A non-limiting example of such a high-k metal gate is a high-k insulation layer 66 (i.e. a layer of material having a dielectric constant K greater than that of silicon dioxide, such as HfO2), a metal layer 68 such as TiAlN, and a polysilicon layer 70. High-k metal gates can be more conductive and provide better performance than gates formed only of polysilicon. Erase gate 42 can have a first portion laterally adjacent to the floating gate 36, and a second portion that extends up and vertically over the floating gate 36, such that the erase gate 42 has a notch 42a facing an edge 36a of the floating gate 36 for better tunneling performing during an erase operation.

By utilizing the first portion of the silicon layer 16 as the floating gate 36 and the first portion of the insulation layer 14 as the floating gate insulator to the bulk silicon 12 for the memory cells 20, and by utilizing the second portion of the silicon layer 16 and the second portion of the insulation layer 14 for the logic devices 22, the process flow used to form the memory device can be significantly simplified. This configuration utilizes the silicon layer 16 of the SOI substrate 10 as a gate (i.e., the floating gate 36) in the memory cell region MC, and as the source, drain and channel regions in the logic device region LG.

The present inventors have determined that using the first portion of the silicon layer 16 (which can be approximately 80-100 Å in thickness) of an SOI substrate 10 for floating gate 36 may present performance issues because the silicon layer 16 may be too thin to act as an effective floating gate. Therefore, as shown in FIG. 2A, a polysilicon layer 62 is formed on the silicon layer 16 in the memory cell region MC, such that the floating gate 36 comprises a combination of the silicon layer 16 and the polysilicon layer 62. The polysilicon layer 62 can be implanted with dopant to increase its conductivity. A non-limiting example can include n+ doping of the polysilicon layer. The combined thickness of silicon layer 16 and the polysilicon layer 62, together as a single floating gate 36, allow for better doping control and avoids programming problems related to ballistic electron transport.

FIGS. 3A-3C illustrates a second example of a memory device formed on an SOI substrate 10, which is the same as the example in FIGS. 2A-2C, except the increased floating gate thickness is achieved by epitaxially growing silicon 64 on silicon layer 16 instead of by forming a polysilicon layer, such that the thickness of floating gate 36 is the combined thicknesses of silicon layer 16 and epitaxially grown silicon 64. Increasing the vertical thickness of floating gate 36 by epitaxial growth on silicon layer 16, and increasing the vertical thickness of the logic source region 46 and the logic drain region 48, can be performed using the same epitaxial growth processing steps.

Figure 4A:
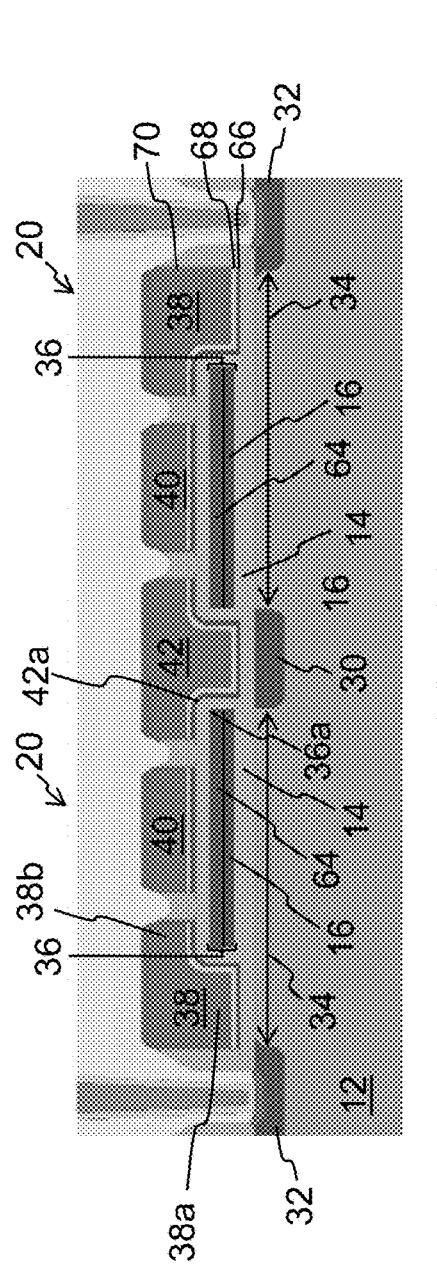
FIG. 4A is a side cross sectional view of memory cells according to a memory device of a third example.
Figure 4C:
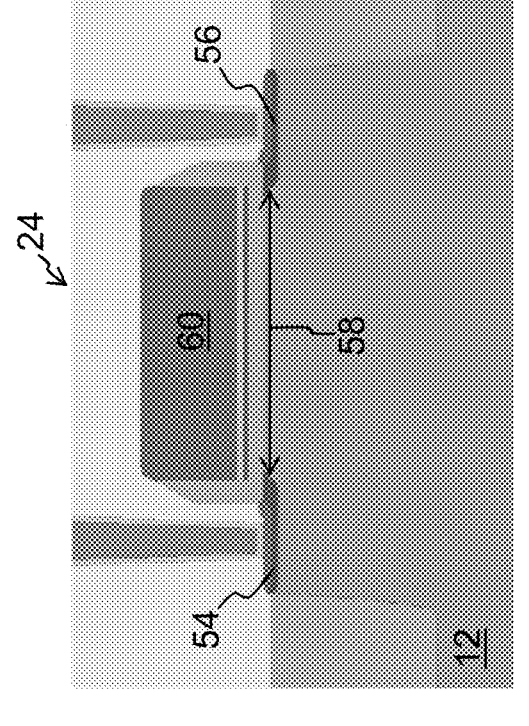
FIG. 4C is a side cross sectional view of a high voltage device according to the memory device of the third example.
Figure 4B:
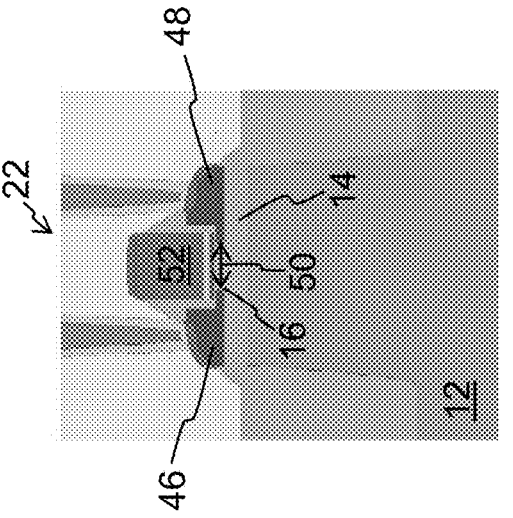
FIG. 4B is a side cross sectional view of a logic device according to the memory device of the third example.

FIGS. 4A-4C illustrates a third example of a memory device formed on an SOI substrate 10, which is the same as the second example in FIGS. 3A-3C, except the select gate 38 has a first portion 38a laterally adjacent the floating gate 36 and a second portion 38b that extends up and vertically over the floating gate 36, such that the spacing between the select gate 38 and the control gate 40 can be reduced for better performance and better control of the isolation between select gate 38 and floating gate 36, which can be critical for programming.

Figure 4D:
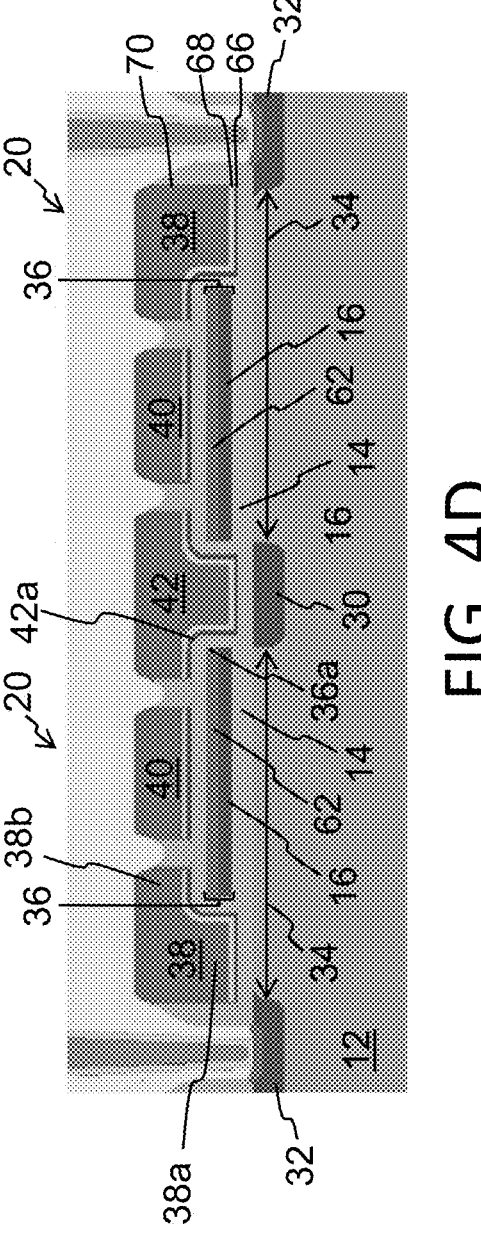
FIG. 4D is a side cross sectional view of memory cells according to a memory device of a fourth example.

FIG. 4D illustrates a fourth example, showing memory cells 20 that are the same as that in the third example of FIG. 4A, except that the floating gates 36 comprise silicon layer 16 and polysilicon layer 62. The logic device 22 as shown in FIG. 4B and the high voltage device 24 as shown in FIG. 4C for the third example of FIG. 4A can be the same for the fourth example of FIG. 4D.

Figure 5A:
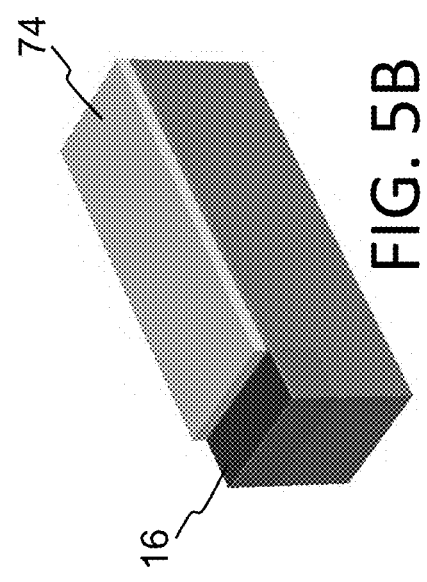
FIGS. 5A-5H are partial perspective views illustrating the formation of the memory device of the first example.
Figure 5B:
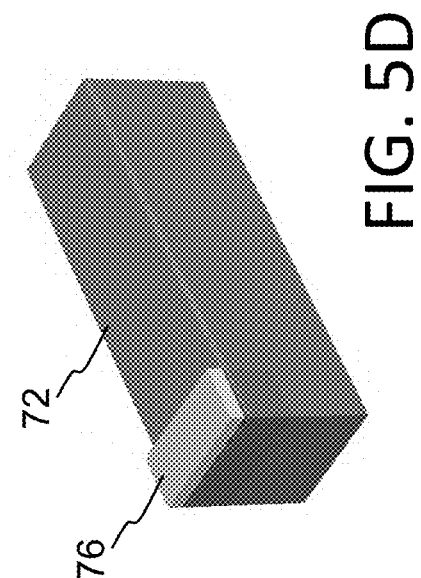
Figure 5C:
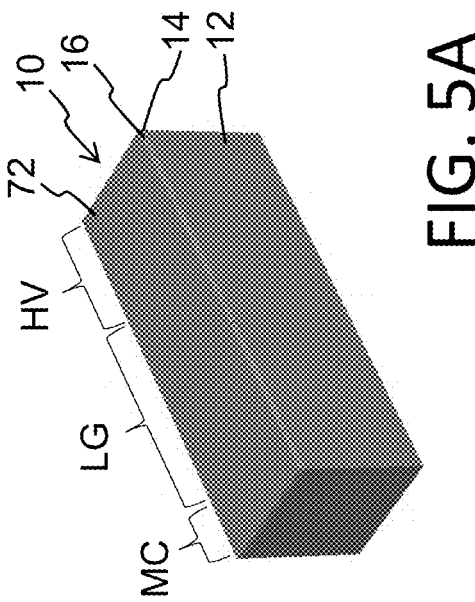
Figure 5D:
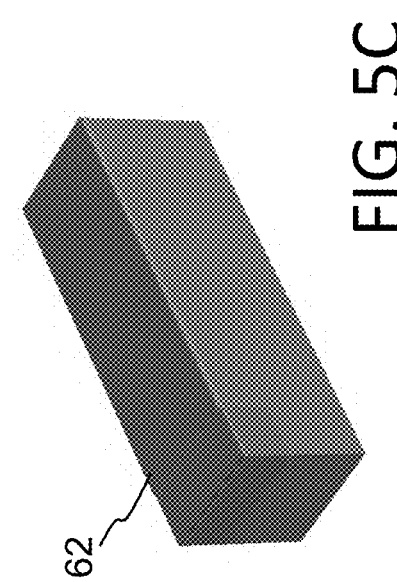

FIGS. 1 and 5A-5H show the process of forming the memory device of FIGS. 2A-2C. The process begins with SOI substrate 10, having bulk silicon 12, insulation layer 14 and silicon layer 16, as illustrated in FIG. 1. An insulation layer 72 such as silicon dioxide (i.e., oxide) is formed on the silicon layer 16, as shown in FIG. 5A. A mask layer 74, such as photoresist or silicon nitride (nitride), is formed on the structure, and then selectively removed from the memory cell region MC, leaving the insulation layer 72 exposed in the memory cell region MC. An oxide etch is used to remove the exposed portion of insulation layer 72 in the memory cell region MC, leaving silicon layer 16 exposed in the memory cell region MC, but not in the logic device region LC or the high voltage device region HV, as shown in FIG. 5B. After mask layer 74 is removed, a polysilicon layer 62 is formed over the structure, as shown in FIG. 5C. A mask layer 76 is formed on the structure, and selectively removed except for the memory cell region MC. An etch is used to remove the exposed polysilicon layer 62 from the logic device region LG and high voltage device region HV as shown in FIG. 5D (where polysilicon layer 62 is maintained in the memory cell region MC under mask layer 76, which polysilicon layer 62 will eventually form a portion of the floating gates along with the underlying silicon layer 16).

Figures 5E, 5F, 5G, 5H:
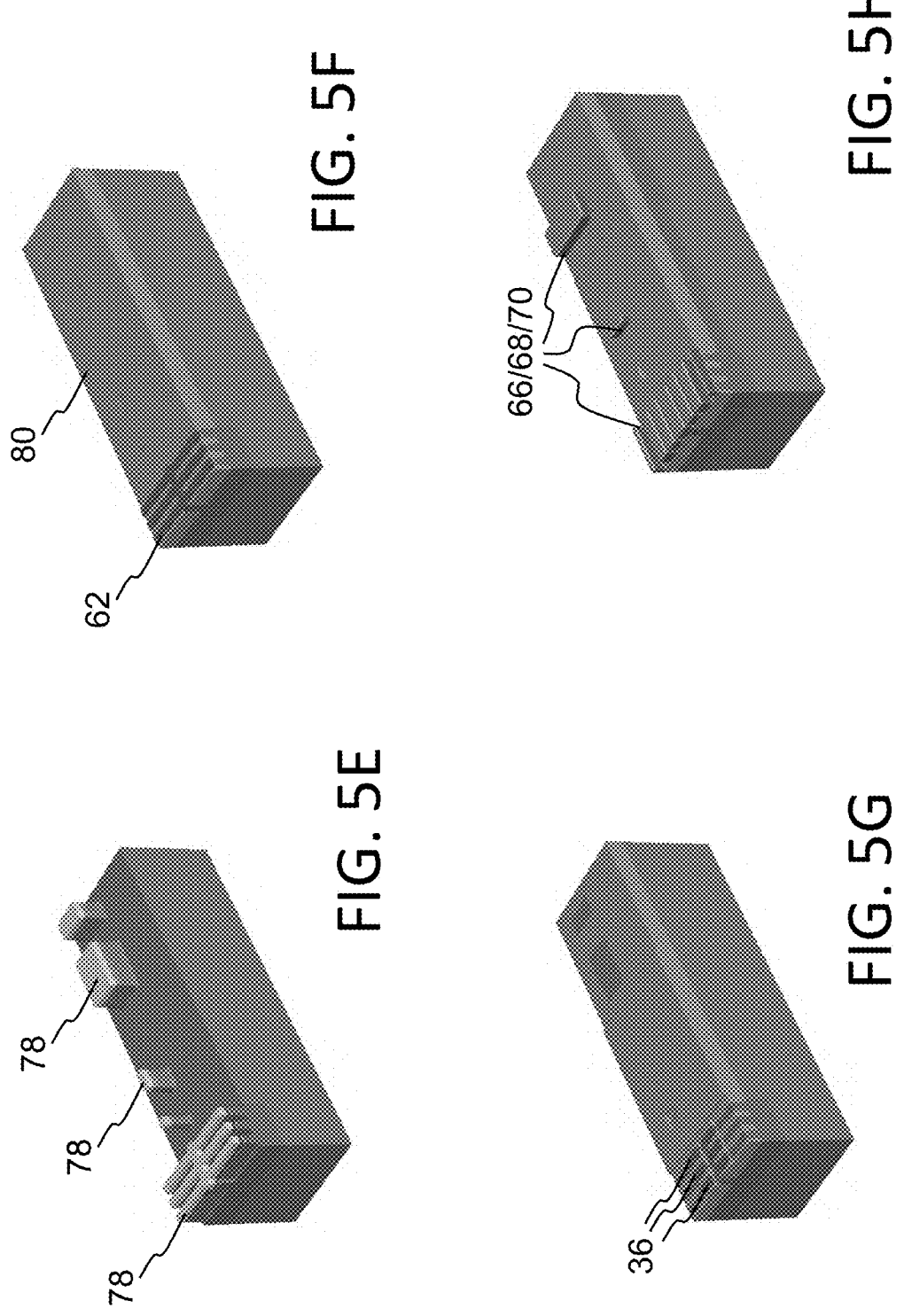

After removing mask layer 76, the structure is patterned using a patterned mask layer 78, where portions of polysilicon layer 62, insulation layer 72, silicon layer 16, insulation layer 14 and portions of bulk silicon 14 are selectively removed to form device structures in each of the memory cell region MC, logic device region LG and high voltage device region HV, as shown in FIG. 5E. The structure is covered with STI insulation 80 which can be oxide, where STI insulation 80 is planarized by chemical mechanical polishing that removes mask layer 78 leaving polysilicon layer 62 exposed in the memory cell region MC, as shown in FIG. 5F. The structure is selectively etched, leaving discrete floating gates 36 of the polysilicon layer 62 and underlying silicon layer 16 in the memory cell region MC as shown in FIG. 5G. Etches and depositions are used to remove silicon layer 16 and insulation layer 14 from the high voltage device region HV and form different gate oxides in the three regions MC/LG/HV, followed by the deposition and patterning (i.e., selective removal) of a high-k insulation layer 66 such as HfO2, a metal layer 68 such as TiAlN, and a polysilicon layer 70, to form the above described select gates 38, control gates 40, erase gates 42, logic gates 52 and HV gates 60 for the memory cells 20, logic devices 22 and high voltage devices 24, respectively, as shown in FIG. 5H, to complete the device structures shown in FIGS. 2A-2C.

Figure 6A:
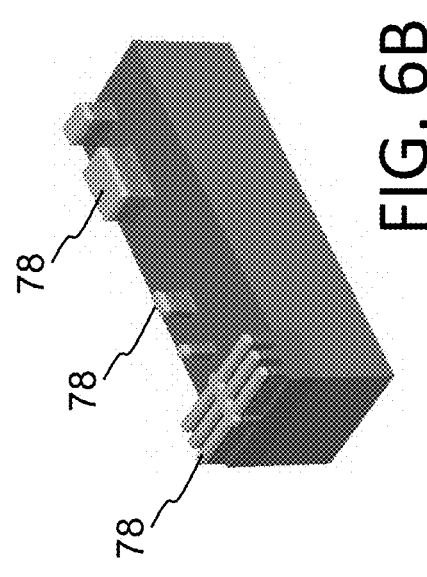
FIGS. 6A-6E are partial perspective views illustrating the formation of the memory device of the second example.
Figure 6B:
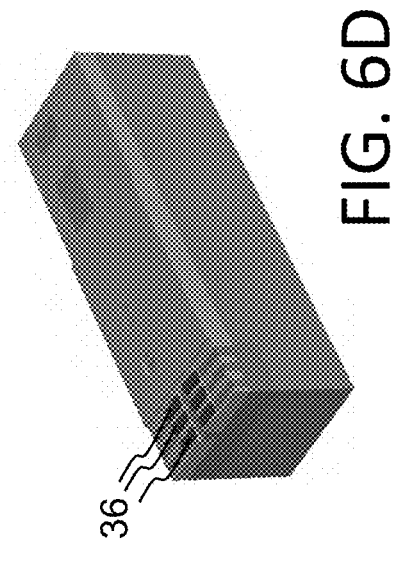
Figure 6C:
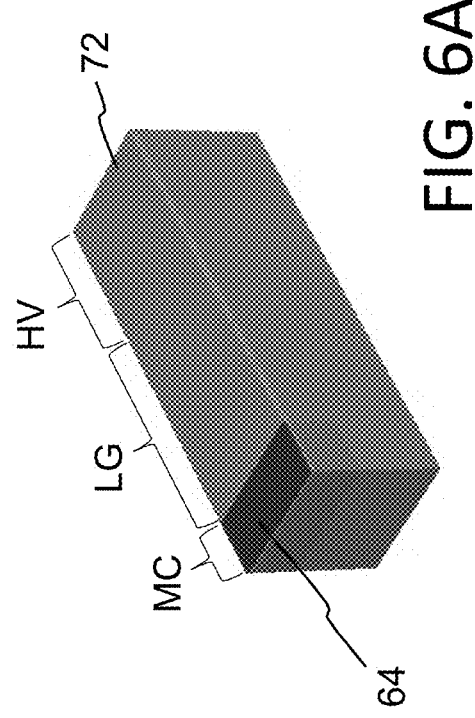
Figure 6D:
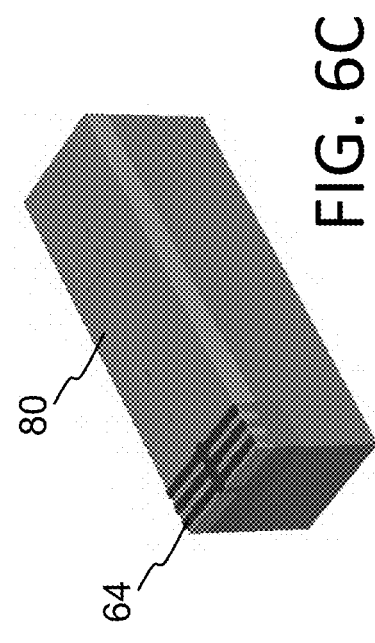
Figure 6E:
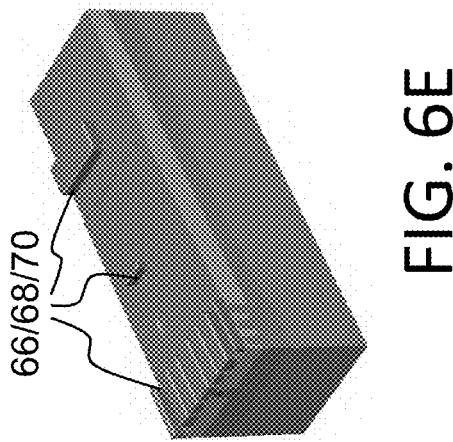

FIGS. 6A-6E show the process of forming the memory device of FIGS. 3A-3C. The process begins with the structure shown in FIG. 5B. However, instead of applying a polysilicon layer directly on the exposed portion of silicon layer 16, selective epitaxy is performed to epitaxially grow silicon 64 on silicon layer 16 (effectively thickening silicon layer 16) in the memory cell region MC, as illustrated in FIG. 6A. While silicon 64 is shown separately in FIG. 4A and FIG. 6A, silicon 64 is not a discrete layer of silicon, but rather indicative of silicon 64 grown on silicon layer 16 to thicken silicon layer 16 by the additionally grown silicon 64. The same steps as described above with respect to FIGS. 5D-5H are performed to complete the structure, namely, using patterned mask layer 78 and etches to form devices structures (FIG. 6B), forming and planarizing STI insulation 80 leaving silicon 64 (i.e., thickened silicon layer 16) exposed (FIG. 6C), selectively etching the structure to leave discrete floating gates 36 of the thickened silicon layer 16 (FIG. 6D), performing etches and depositions to remove silicon layer 16 and insulation layer 14 from the high voltage device region HV and to form different gate oxides in the three regions MC/LG/HV, followed by the deposition and patterning (i.e., selective removal) of a high-k insulation layer 66, a metal layer 68 and a polysilicon layer 70 to form the complete the device structures shown in FIGS. 3A-3C (FIG. 6E).

Figures 7A, 7B, 7C:
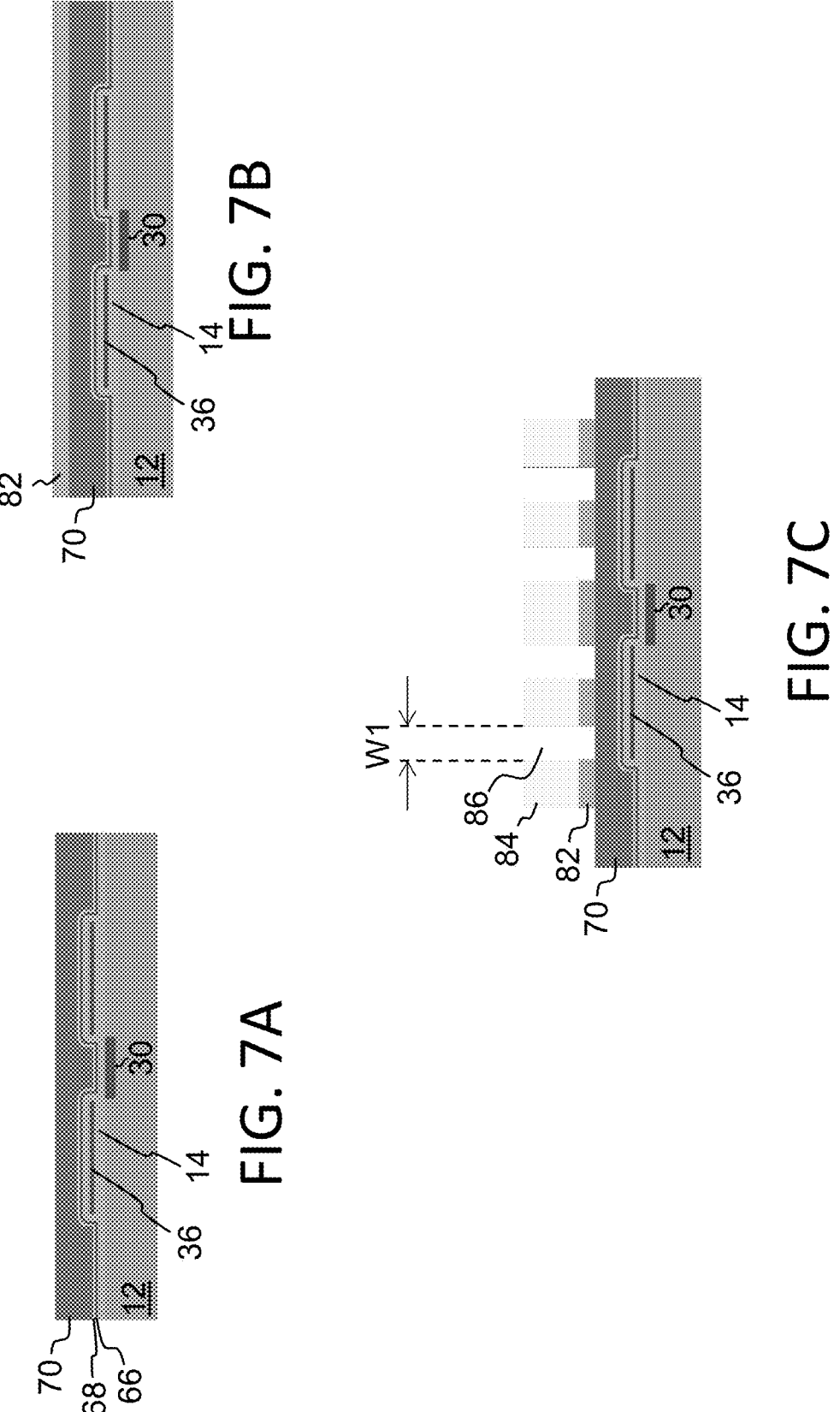
FIGS. 7A-7F are partial perspective views illustrating the formation of the memory device of the third example.
Figures 7D, 7E, 7F:
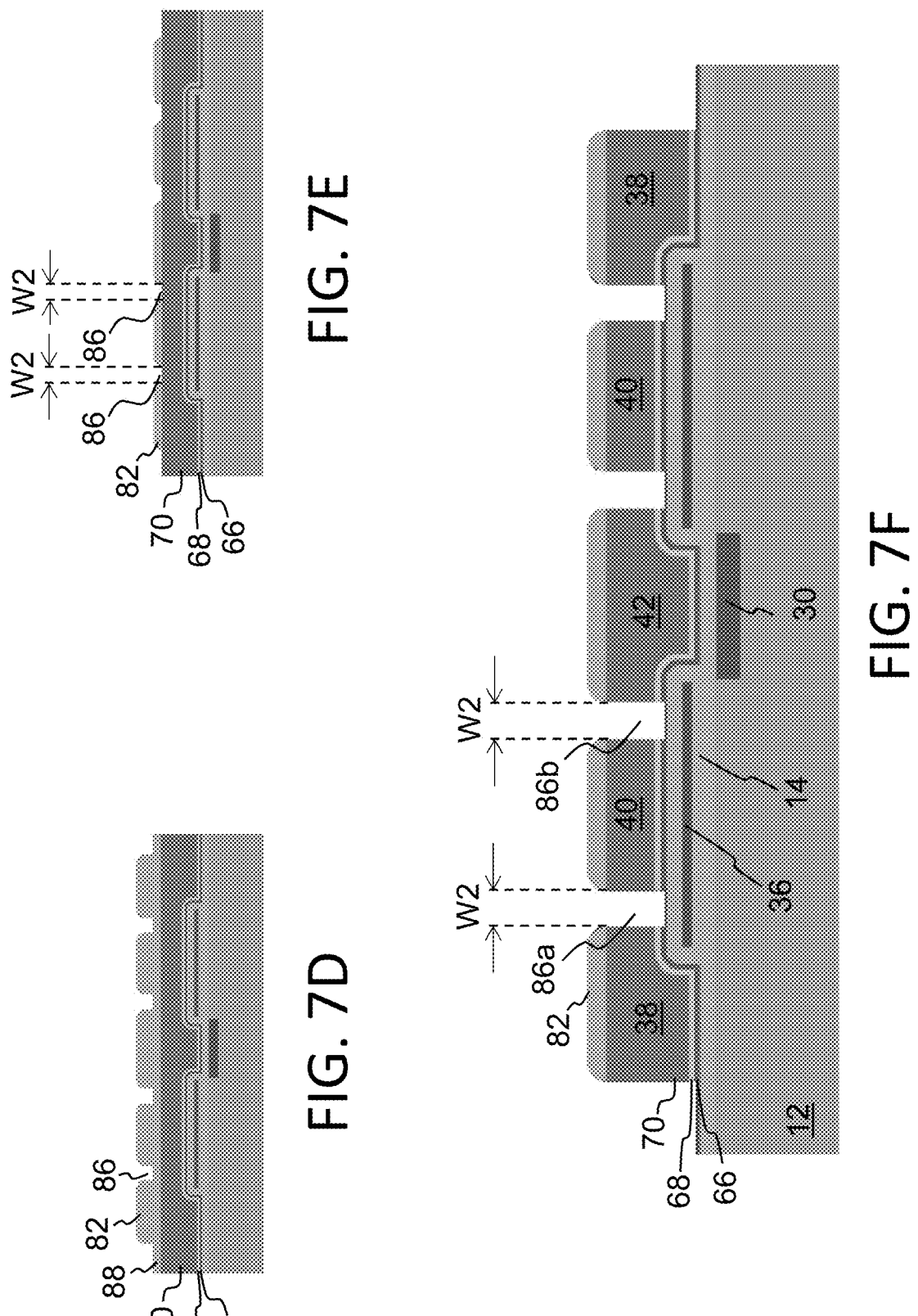

FIGS. 7A-7F show the process of forming the memory device of FIGS. 4A-4C. The process begins with the structure of FIG. 6D. After the etches and depositions to remove silicon layer 16 and insulation layer 14 from the high voltage device region HV and to form different gate oxides in the three regions MC/LG/HV, and the deposition of high-k insulation layer 66, metal layer 68 and polysilicon layer 70, the resulting structure in the memory cell region MC is shown in FIG. 7A. A first mask layer 82, which can be oxide, is formed on polysilicon layer 70, as shown in FIG. 7B. The first mask layer 82 is patterned (i.e., selective removal) using photoresist 84, leaving openings 86 in the first mask layer 82 that expose portions of polysilicon layer 70 vertically over the floating gate 36, as shown in FIG. 7C. The openings 86 can have a first width W1. After removal of the photoresist 84, a second mask layer 88, which can be the same material as that of first mask layer 82, is formed on the structure. The second mask layer 88 can have a thickness that makes the openings 86 narrower, with second mask layer 88 disposed at the bottoms of openings 86, as shown in FIG. 7D. An anisotropic etch follows, which removes the second mask layer 88 from the bottoms of openings 86 while leaving spacers of layer 88 along the vertical sidewalls of layer 82 in openings 86, resulting in openings 86 extending down to the polysilicon layer 70 and having a second width W2 that is smaller than the first width W1, as shown in FIG. 7E. One or more etches are used to remove the portions of polysilicon layer 70, metal layer 68 and high-k insulation layer 66 under the openings 86, extending the openings 86 of width W2 through polysilicon layer 70, metal layer 68 and high-k insulation layer 66. As shown in FIG. 7F, this results in a gap 86a of width W2 between the control gate 40 and select gate 38, and a gap 86b of width W2 between the control gate 40 and erase gate 42, where second width W2 is smaller than first width W1 defined by lithography as shown in FIG. 7C. This allows for gaps of second width W2 between the control gate 40 and the adjacent select gate 38 and erase gate 42 to be less that the lithography resolution limit used to originally create openings 86 with width W1. Moreover, by having the gaps 86a, 86b between control gate 40 and adjacent select gate 38 and erase gate 42 positioned vertically over the floating gate 36, low-density CMOS spacer materials between floating gate 36 and select gate 38 in direct proximity with silicon substrate 12 that might result in charge trapping during programming and related reliability issues can be avoided.

It should be noted that the process described above with respect to FIGS. 7A-7F showing the process of forming the memory device of FIGS. 4A-4C can be used form the memory device of FIG. 4D. The only modification can be starting with the structure of FIG. 5G instead of the structure of FIG. 6D.

The above-described techniques have many advantages. The same layers of material are used to form the gates of these devices except for the floating gate, thereby simplifying and making a more reliable fabrication process. These techniques improve the functionality and reliability of the memory cell and its fabrication. The increased floating gate thickness allows for better doping control and avoids programming problems related to ballistic electron transport. The spacer-enhanced patterning technique allows for the reduction of the spacing between the floating gate and the select gate, thereby improving conditions for programming by hot electron injection. The spacer-enhanced patterning technique provides for the spacing between the control gate and the select gate to be positioned vertically over the floating gate, and decorrelates the spacing between the select gate and the floating gate and the spacing between the control gate and the select gate to avoid the presence of low-density spacer material in the isolation gap between the select gate 38 and the floating gate 36 adjacent the substrate 12, thus limiting unwanted charge trapping during programming and improving endurance performance.

It is to be understood that the present disclosure is not limited to the example(s) described above and illustrated herein, but encompasses any and all variations falling within the scope of any claims. For example, references to the present disclosure or invention or examples herein are not intended to limit the scope of any claim or claim term, but instead merely make reference to one or more features that may be covered by one or more claims. Materials, processes and numerical examples described above are exemplary only, and should not be deemed to limit the claims. Single layers of material could be formed as multiple layers of such or similar materials, and vice versa. Lastly, the terms "forming" and "formed" as used herein shall include material deposition, material growth, or any other technique in providing the material as disclosed or claimed.

What is claimed is:

1. A memory device, comprising:
a SOI substrate that comprises bulk silicon, an insulation layer vertically over the bulk silicon, and a silicon layer vertically over the insulation layer; and a memory cell disposed in a memory cell region of the SOI substrate, wherein the memory cell includes:
a source region and a drain region formed in the bulk silicon, with a channel region of the bulk silicon extending therebetween,
a floating gate comprising:
a first portion of the silicon layer disposed vertically over and insulated from a first portion of the channel region by the insulation layer, and
a layer of polysilicon on the first portion of the silicon layer,
a select gate disposed vertically over and insulated from a second portion of the channel region,
a control gate disposed vertically over and insulated from the floating gate, and
an erase gate disposed vertically over and insulated from the source region.

2. The memory device of claim 1, comprising:
a logic device disposed in a logic device region of the SOI substrate, wherein the logic device includes:
a logic source region and a logic drain region formed in a second portion of the silicon layer, with a logic channel region of the silicon layer extending therebetween, and
a logic gate disposed vertically over and insulated from the logic channel region.

3. The memory device of claim 2, comprising:
a high voltage device disposed in a high voltage device region of the SOI substrate, wherein the high voltage device includes:
a HV source region and a HV drain region formed in the bulk silicon, with a HV channel region of the bulk silicon extending therebetween, and
a HV gate disposed vertically over and insulated from the HV channel region.

4. The memory device of claim 3, wherein the select gate, the control gate, the erase gate, the logic gate and the HV gate respectively include a high-k insulation layer, a metal layer and a polysilicon layer.

5. The memory device of claim 1, wherein the erase gate includes a notch facing an edge of the floating gate.

6. A method of forming a memory device, comprising:
providing a SOI substrate that comprises bulk silicon, an insulation layer vertically over the bulk silicon, and a silicon layer vertically over the insulation layer; and
forming a memory cell in a memory cell region of the SOI substrate by:
forming a source region and a drain region in the bulk silicon, with a channel region of the bulk silicon extending therebetween,
forming a floating gate comprising a first portion of the silicon layer disposed vertically over and insulated from a first portion of the channel region by the insulation layer, wherein the forming the floating gate comprises epitaxially growing silicon on the first portion of the silicon layer or forming a layer of polysilicon on the first portion of the silicon layer,
forming a select gate disposed vertically over and insulated from a second portion of the channel region,
forming a control gate disposed vertically over and insulated from the floating gate, and
forming an erase gate disposed vertically over and insulated from the source region.

7. The method of claim 6, wherein the forming of the erase gate comprises forming a notch in the erase gate that faces an edge of the floating gate.

8. The method of claim 6, wherein the forming of the select gate, the control gate, and the erase gate comprises:

forming a high-k insulation layer in the memory cell region;

forming a metal layer on the high-k insulation layer in the memory cell region;

forming a polysilicon layer on the metal layer in the memory cell region;

forming a first mask layer on the polysilicon layer in the memory cell region;

forming openings in the first mask layer having a first width;

forming a second mask layer on the first mask layer and in the openings;

removing some of the second mask layer so that the openings extend down to the polysilicon layer and have a second width less than the first width; and removing portions of the polysilicon layer, the metal layer and the high-k insulation layer vertically under the openings, leaving a first gap of the second width between the control gate and the select gate and a second gap of the second width between the control gate and the erase gate.

9. The method of claim 8, wherein the first gap and the second gap are disposed vertically over the floating gate.

10. The method of claim 6, comprising:

forming a logic device in a logic device region of the SOI substrate by:

forming a logic source region and a logic drain region in a second portion of the silicon layer, with a logic channel region of the first portion of the silicon layer extending therebetween, and forming a logic gate disposed vertically over and insulated from the logic channel region.

11. The method of claim 10, comprising:

forming a high voltage device in a high voltage device region of the SOI substrate by:

forming an HV source region and an HV drain region in the bulk silicon, with an HV channel region of the bulk silicon extending therebetween, and

forming an HV gate disposed vertically over and insulated from the HV channel region.

12. The method of claim 11, wherein the forming of the select gate, the control gate, the erase gate, the logic gate and the HV gate comprises forming a high-k insulation layer, a metal layer and a polysilicon layer.

13. The method of claim 11, wherein the forming of the select gate, the control gate, the erase gate, the logic gate and the HV gate comprises:

forming a high-k insulation layer in the memory cell region, the logic device region and the high voltage device region;

forming a metal layer on the high-k insulation layer in the memory cell region, the logic device region and the high voltage device region;

forming a polysilicon layer on the metal layer in the memory cell region, the logic device region and the high voltage device region; and selectively removing the high-k insulation layer, the metal layer and the polysilicon layer in the memory cell region, the logic device region and the high voltage device region, leaving the select gate, the control gate, the erase gate, the logic gate and the HV gate of the high-k insulation layer, the metal layer and the polysilicon layer.

14. The method of claim 11, wherein the forming of the floating gate comprises epitaxially growing silicon on the first portion of the silicon layer.

15. The method of claim 14, wherein the forming the floating gate comprises:

forming an insulation layer on the silicon layer in the memory cell region, the logic device region and the high voltage device region; and removing the insulation layer from at least a portion of the memory cell region to expose the first portion of the silicon layer before the epitaxially growing silicon on the first portion of the silicon layer.

16. The method of claim 6, wherein the forming of the floating gate comprises forming the layer of polysilicon on the first portion of the silicon layer.

* * * * *